United States Patent
Rinne et al.

[19]

[11] Patent Number: 5,963,793
[45] Date of Patent: Oct. 5, 1999

[54] MICROELECTRONIC PACKAGING USING ARCHED SOLDER COLUMNS

[75] Inventors: Glenn A. Rinne, Cary; Philip A. Deane, Durham, both of N.C.

[73] Assignee: MCNC, Research Triangle Park, N.C.

[21] Appl. No.: 09/096,754

[22] Filed: Jun. 12, 1998

Related U.S. Application Data

[62] Division of application No. 08/654,539, May 29, 1996, Pat. No. 5,793,116.

[51] Int. Cl.⁶ .......................... H01L 21/44; H01L 21/48; H01L 21/50
[52] U.S. Cl. ........................ 438/107; 438/106; 438/612
[58] Field of Search .................................. 438/107, 106, 438/612

[56] References Cited

U.S. PATENT DOCUMENTS

| | | |
|---|---|---|
| 3,105,869 | 10/1963 | Branch et al. . |
| 3,501,681 | 3/1970 | Weir ........................................ 317/234 |
| 3,663,184 | 5/1972 | Wood et al. ............................. 29/195 |
| 3,760,238 | 9/1973 | Hamer et al. ....................... 317/234 R |
| 3,770,874 | 11/1973 | Krieger et al. .......................... 174/68.5 |
| 3,871,014 | 3/1975 | King et al. ................................ 357/67 |
| 3,897,871 | 8/1975 | Zinnbauer . |
| 3,942,187 | 3/1976 | Gelsing et al. ........................... 357/71 |
| 4,074,342 | 2/1978 | Honn et al. . |
| 4,113,578 | 9/1978 | Del Monte ................................ 204/15 |
| 4,382,517 | 5/1983 | Welsch . |
| 4,473,263 | 9/1984 | Sunstein . |
| 4,532,576 | 7/1985 | Reimer . |
| 4,657,146 | 4/1987 | Walters . |
| 4,855,809 | 8/1989 | Malhi et al. . |
| 4,948,754 | 8/1990 | Kondo et al. ........................... 437/183 |
| 4,950,623 | 8/1990 | Dishon ..................................... 437/183 |
| 4,962,058 | 10/1990 | Cronin et al. ........................... 437/187 |
| 5,022,580 | 6/1991 | Pedder ..................................... 438/108 |
| 5,113,314 | 5/1992 | Wheeler et al. ......................... 361/384 |
| 5,160,409 | 11/1992 | Moore et al. ............................ 156/656 |
| 5,162,257 | 11/1992 | Yung ........................................ 437/183 |
| 5,194,137 | 3/1993 | Moore et al. ............................ 205/125 |
| 5,239,447 | 8/1993 | Cotues et al. . |
| 5,240,881 | 8/1993 | Cayetano et al. ....................... 438/106 |
| 5,250,843 | 10/1993 | Eichelberger .......................... 257/692 |
| 5,289,925 | 3/1994 | Newmark . |
| 5,293,006 | 3/1994 | Yung ........................................ 174/261 |
| 5,327,013 | 7/1994 | Moore et al. ............................ 257/772 |
| 5,327,327 | 7/1994 | Irew et al. . |
| 5,335,795 | 8/1994 | Chizen . |
| 5,347,428 | 9/1994 | Carson et al. ........................... 361/760 |
| 5,354,711 | 10/1994 | Heitzmann et al. .................... 437/182 |
| 5,406,701 | 4/1995 | Pepe et al. ................................. 29/840 |
| 5,424,920 | 6/1995 | Miyake .................................... 361/735 |
| 5,432,729 | 7/1995 | Carson et al. ............................. 365/63 |
| 5,453,582 | 9/1995 | Amano et al. .......................... 174/261 |
| 5,616,962 | 4/1997 | Ishikawa et al. . |
| 5,680,296 | 10/1997 | Hileman et al. . |
| 5,739,053 | 4/1998 | Kawakita et al. ....................... 438/108 |
| 5,744,382 | 4/1998 | Kitayama et al. ...................... 438/106 |
| 5,751,556 | 5/1998 | Butler et al. . |

*Primary Examiner*—Kevin M. Picardat
*Assistant Examiner*—Deven Collins
*Attorney, Agent, or Firm*—Alston & Bird LLP

[57] ABSTRACT

Microelectronic packages are formed wherein solder bumps on one or more substrates are expanded, to thereby extend and contact the second substrate and form a solder connection. The solder bumps are preferably expanded by reflowing additional solder into the plurality of solder bumps. The additional solder may be reflowed from an elongated, narrow solder-containing region adjacent the solder bump, into the solder bump. After reflow, the solder bump which extends across a pair of adjacent substrates forms an arched solder column or partial ring of solder between the two substrates.

21 Claims, 6 Drawing Sheets

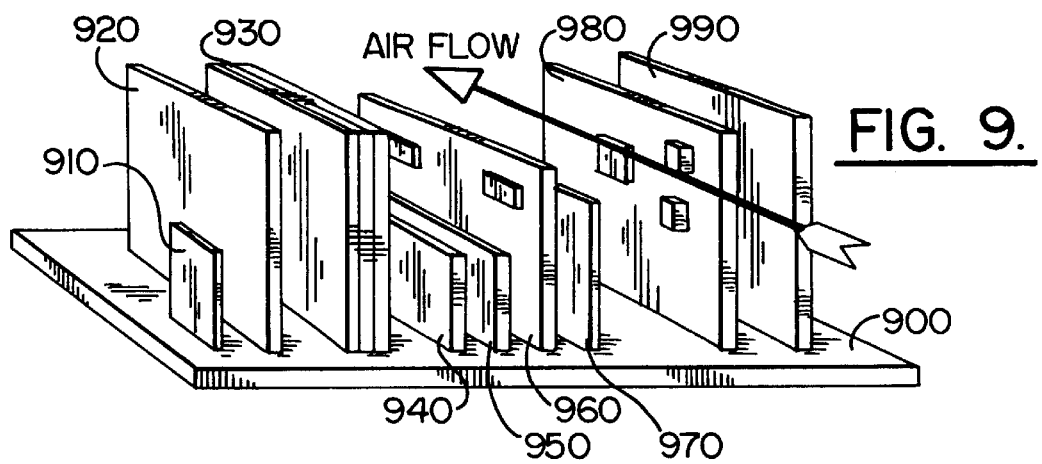
FIG. 9.
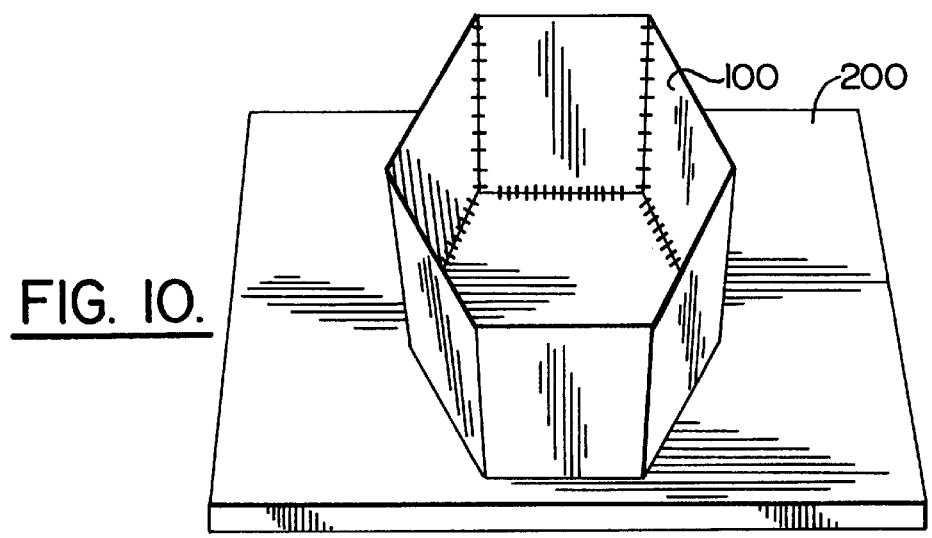
FIG. 10.
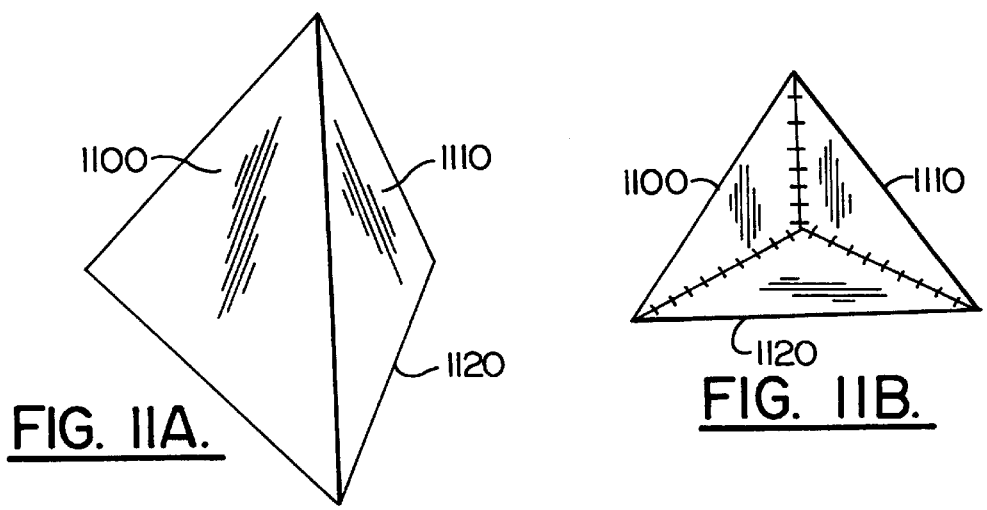
FIG. 11A.
FIG. 11B.

MICROELECTRONIC PACKAGING USING ARCHED SOLDER COLUMNS

This application is a divisional of application Ser. No. 08/654,539, filed May 29, 1996, now U.S. Pat. No. 5,793,116 entitled "Miroelectronic Packaging Using Arched Solder Columns," the disclosure of which is incorporated herein by reference as if set forth in full.

FIELD OF THE INVENTION

This invention relates to microelectronic devices and methods, and more particularly to microelectronic packages and packaging methods.

BACKGROUND OF THE INVENTION

In packaging microelectronic devices, such as packaging integrated circuit chips on printed circuit boards, the integrated circuit chips are generally mounted parallel to and facing the printed circuit board such that faces of the integrated circuit chips are adjacent a face of the circuit board. This packaging technology allows a large number of input/output connections between the integrated circuit chips and the printed circuit board, especially when solder bump technology is used over the entire face of the integrated circuit chips. However, this technology limits the packaging density, because the large faces of the integrated circuit chips are mounted adjacent the face of the printed circuit board.

In order to increase the packaging density of chips on a printed circuit board, three-dimensional packaging has been proposed, wherein the chips are mounted orthogonal to the circuit board so that edges of the chips are adjacent the face of the circuit board. See, for example, U.S. Pat. No. 5,347,428 to Carson et al. entitled "Module Comprising IC Memory Stack Dedicated to and Structurally Combined With an IC Microprocessor Chip" and U.S. Pat. No. 5,432,729 to Carson et al. entitled "Electronic Module Comprising a Stack of IC Chips Each Interacting With an IC Chip Secured to the Stack", both of which are assigned to Irvine Sensors Corporation. In these patents, solder bumps are used to connect the edges, rather than the faces of integrated circuit chips to a substrate. Unfortunately, an edge-to-face connection may be difficult and costly to produce.

U.S. Pat. No. 5,113,314 to Wheeler et al. entitled "High Speed, High Density Chip Mounting" describes another three-dimensional packaging technique. The '314 patent describes a plurality of integrated circuit chips whose active faces are perpendicular to a chip carrier. Solder bumps are used to connect pads on the chips to pads on the substrate.

A critical issue in using solder bump technology to interconnect a three-dimensional package is how to get the solder bump to bridge from one substrate to another. In particular, it is difficult to form solder which extends beyond the edge of a chip because the chip sawing or dicing operation would remove the solder which extends beyond the chip edge. Moreover, during solder reflow, it is well known that the solder takes the shape of a hemisphere or partial hemisphere on a contact pad. Thus, it is difficult to cause the solder on one contact pad to extend onto another contact pad, in a three-dimensional package. Even if solder is placed on a pair of adjacent contact pads in a three-dimensional package, it is difficult to cause the reflowed solder to join up, rather than forming individual solder bumps.

SUMMARY OF THE INVENTION

The present invention includes methods of forming a microelectronic package in which solder bumps on one substrate are expanded, to thereby extend to and contact a second substrate and thereby form a solder connection. In particular, a first microelectronic substrate is oriented relative to a second microelectronic substrate, such than an edge of the second microelectronic substrate is adjacent the first microelectronic substrate. One of the first and second microelectronic substrates includes a plurality of solder bumps thereon, adjacent the edge of the second microelectronic substrate. The plurality of solder bumps are expanded to extend to and contact the other of the first and second microelectronic substrates.

In a preferred embodiment of the present invention, the plurality of solder bumps are expanded by reflowing additional solder into the plurality of solder bumps. The additional solder may be reflowed from an elongated, narrow solder-containing region adjacent the solder bump, into the solder bump. Surface tension from the elongated solder-containing region causes the solder to flow from the elongated solder-containing region into the solder bump, thereby expanding the volume of the solder bump and causing it to extend to and contact the other substrate.

The plurality of solder bumps may be formed on the second microelectronic substrate adjacent the edge thereof. The solder bumps are caused to extend laterally beyond the edge of the second microelectronic substrate, to thereby contact the first microelectronic substrate. The solder bumps may be caused to extend laterally by reflowing additional solder into the plurality of solder bumps from an elongated, solder region adjacent the solder bump. Accordingly, solder bumps may be caused to bridge a gap to extend onto and contact an adjacent pad.

After reflow, the solder bump which extends across a pair of adjacent substrates forms an arched solder column between the two substrates. The arched solder column preferably is of uniform circular cross-section, which makes the arched solder column an excellent conductor for high speed microelectronic device operations. The arched solder column may also be regarded as a partial ring of solder.

A microelectronic package according to the present invention, includes a first microelectronic substrate and a second microelectronic substrate which is oriented relative to the first microelectronic substrate, such that an edge of the second microelectronic substrate is adjacent the first microelectronic substrate. A plurality of arched solder columns each extend from adjacent the edge of the second microelectronic substrate to the first microelectronic substrate. The arched solder columns may also be regarded as partial rings of solder.

The microelectronic substrates may be oriented in non-parallel relationship to one another. They may be obliquely oriented relative to one another. They may be oriented in orthogonal relationship to one another, such that the arched solder columns form quarter rings of solder. They may be oriented coplanar with one another, such that the arched solder columns form half rings of solder, spanning adjacent substrate edges.

The above-described microelectronic packages may be extended to include a third microelectronic substrate which is oriented in nonparallel relationship to the first microelectronic substrate, such that an edge of the third microelectronic substrate is adjacent the first microelectronic substrate. A plurality of second arched solder columns each extend from adjacent the edge of the third microelectronic substrate to the first microelectronic substrate. Thus, a plurality of microelectronic substrates may be mounted on another microelectronic substrate.

Moreover, a fourth microelectronic substrate may be oriented parallel to or orthogonal to the first microelectronic substrate, such that a second edge of the second microelectronic substrate and a second edge of the third microelectronic substrate are adjacent the fourth microelectronic substrate. A plurality of third arched solder columns each extend from adjacent the second edge of the second microelectronic substrate to the fourth microelectronic substrate. A plurality of fourth arched solder columns each extend from adjacent the second edge of the third microelectronic substrate to the fourth microelectronic substrate. Accordingly, a plurality of microelectronic substrates may be connected to a plurality of other microelectronic substrates to form cube-like structures. In other embodiments, the second and third microelectronic substrates may be triangular second and third microelectronic substrates which can be used to form retroreflectors for laser beams and other oblique structures.

In a preferred microelectronic package according to the invention, a second microelectronic substrate is oriented in nonparallel or coplanar relationship to a first microelectronic substrate such that an edge of the second microelectronic substrate is adjacent the first microelectronic substrate. A first row of pads is located on the first microelectronic substrate. A second row of pads is located on the second microelectronic substrate, adjacent and extending along the edge of the second microelectronic substrate. At least one of the first and second rows of pads includes a plurality of elongated pad extensions which are narrower than the pads, and having a solder layer thereon. A respective one of the elongated pad extensions is connected to a respective pad in the at least one of the first and second rows of pads.

A plurality of solder structures extend from a pad in the first row of pads to a pad in the second row of pads. The plurality of solder structures preferably comprise a plurality of arched solder columns. The elongated pad extensions include a solder layer thereon so that during reflow the solder on the elongated pad extension flows onto the adjacent pad and expands the solder bump thereon, as already described. Accordingly, the present invention allows solder bump technology to bridge between substrates. Three-dimensional electronic packages may thereby be created.

BRIEF DESCRIPTION OF THE DRAWINGS

FIGS. 5–12 illustrate alternate embodiments of microelectronic packages according to the present invention.

DETAILED DESCRIPTION OF PREFERRED EMBODIMENTS

Figure 1:
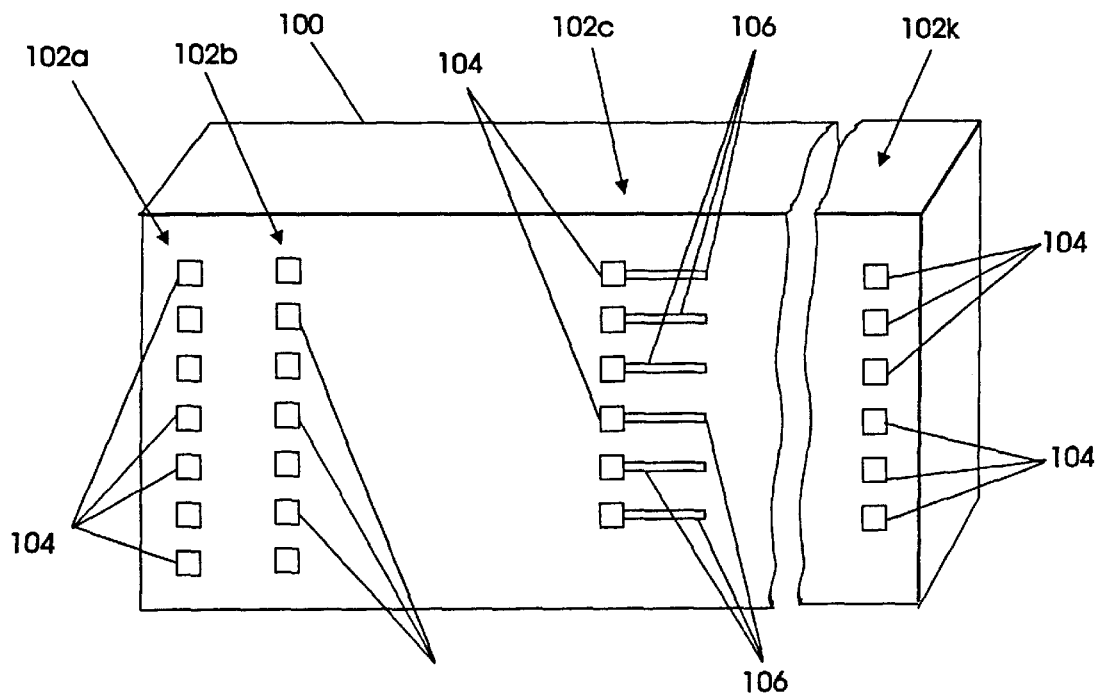
FIG. 1 illustrates a perspective view of a first microelectronic substrate according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2:
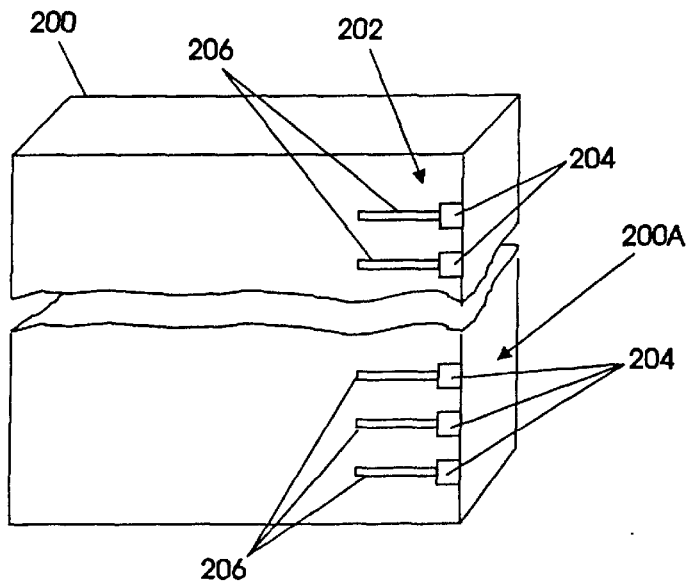
FIG. 2 illustrates a perspective view of a second microelectronic substrate according to the present invention.

Referring now to FIGS. 1 and 2, first and second microelectronic substrates which can form a microelectronic package according to the present invention are illustrated. FIG. 1 illustrates a perspective view of a first microelectronic substrate 100. The substrate 100 includes a plurality of rows 102a-102k of pads 104. As shown in FIG. 1, the rows 102 of pads 104 may have different numbers and sizes of pads and may be spaced at various locations on first substrate 100. Moreover, although square pads are illustrated, they can take any shape. Rows of pads may also be included on the back face of substrate 100 or on one or more edges of the substrate (not shown). Some adjacent pairs of rows, such as rows 102c and 102k may be used to contact separate substrates. Other adjacent pairs of rows, such as rows 102a and 102b may be used to contact the front and back faces of a single substrate.

First microelectronic substrate 100 may be an integrated circuit chip, a printed circuit board, a multi-layer ceramic substrate, or any other substrate which is used in microelectronics. The fabrication of pads on microelectronic substrates is well known to those having skill in the art and need not be described further herein.

FIG. 2 illustrates a perspective view of a second microelectronic substrate. As shown in FIG. 2, second microelectronic substrate 200 includes a row 202 of pads 204 at an edge adjacent and extending along an edge 200a of the second substrate 200. These pads preferably have a spacing which corresponds to the spacing of at least one row of pads 102 in first microelectronic substrate 100. It will be understood that the pad pitches need not be identical, because one substrate can be mounted on another substrate at an angle, so that one pad pitch may be less than the other pitch. Similar to the first microelectronic substrate, second microelectronic substrate 200 may be any type of substrate used in microelectronic systems.

As will be described below, substrate 200 is mounted on substrate 100 by forming solder structures, preferably arched solder columns, between the pads in a row on the first substrate and the pads in the row on the second substrate. In order to form the solder structures, in a preferred embodiment of the invention, at least one of the first and second rows of pads includes elongated pad extensions which are narrower than the pads. Thus, as shown in FIG. 1, row 102c includes a plurality of elongated pad extensions 106, which are narrower than the pads. A respective one of the elongated pad extensions 106 is connected to a respective pad 104 in the row of pads 102c. Similarly, in FIG. 2, each pad 204 includes an elongated pad extension 206 which is narrower than the pads. A respective pad extension 206 is connected to a respective pad 204. The pad extensions, and also preferably the pads, include a layer of solder thereon.

Figure 3A:
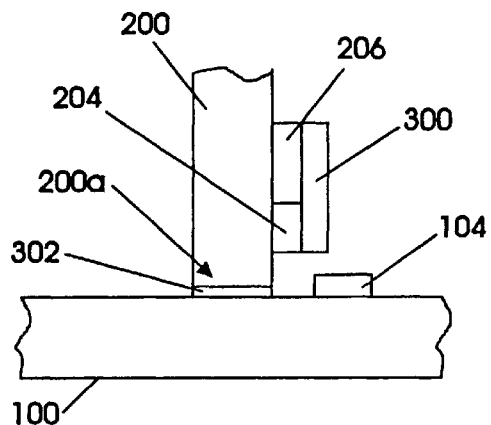
FIGS. 3A–3D are cross-sectional views of a microelectronic package according to the present invention, during intermediate fabrication steps.

FIGS. 3A–3D are cross-sectional views of a microelectronic package according to the present invention, using substrates 100 and 200, during intermediate fabrication steps. As shown in FIG. 3A, first microelectronic substrate 100 is oriented in nonparallel relationship to second microelectronic substrate 200, such that an edge 200a of the second microelectronic substrate 200 is adjacent the first microelectronic substrate 100. The first microelectronic substrate includes a first row of pads 104, for example row 102k of FIG. 1, and the second microelectronic substrate 200 includes a second row 202 of pads 204 adjacent and extending along the edge 200a of the second microelectronic substrate 200. It will also be understood that three or more substrates, having three or more rows of pads, may be oriented together for bonding.

As also shown in FIG. 3A, one of the first and second rows of pads includes a plurality of elongated pad extensions 206. It will be understood by those having skill in the art that pad extensions may be formed on first substrate 100, second substrate 200 or both, depending upon the particular geometries of the pads, the volumes of solder bumps which are to be formed and other package parameters. As also shown in FIG. 3A, the elongated pad extension 206 and the associated row of pads 204 include solder 300 thereon. It will be understood that the pads and pad extensions may be formed of exposed portions of a larger layer which is patterned by a mask.

FIG. 3A illustrates the second microelectronic substrate 200 oriented orthogonal to the first microelectronic substrate 100. However, it will also be understood that the first and second microelectronic substrates may be oriented obliquely relative to one another. FIG. 3A also illustrates a bonding layer 302 which may be used to secure the substrates to one another prior to solder attach. The bonding layer may be flux or other common adhesives used in the microelectronic industry. Alternatively, a clamp or other fixture may be used to hold the substrates together in the absence of a bonding layer, or the force of gravity may hold them in place.

The formation of a solder layer 300 on pads 204 and pad extensions 206 may be accomplished using many techniques. For example, a solder dam may be used to define the pads and/or pad extensions by exposing the pads and pad extensions in a larger solder wettable layer. Techniques for forming a solder layer on solder pads and extension regions are described in application Ser. No. 08/416,619 to coinventor Rinne et al. filed on Apr. 5, 1995 and entitled "Methods for Forming Integrated Redistribution Routing Conductors and Solder Bumps and Structures Formed Thereby", assigned to the assignee of the present application, the disclosure of which is hereby incorporated herein by reference.

Figure 3B:
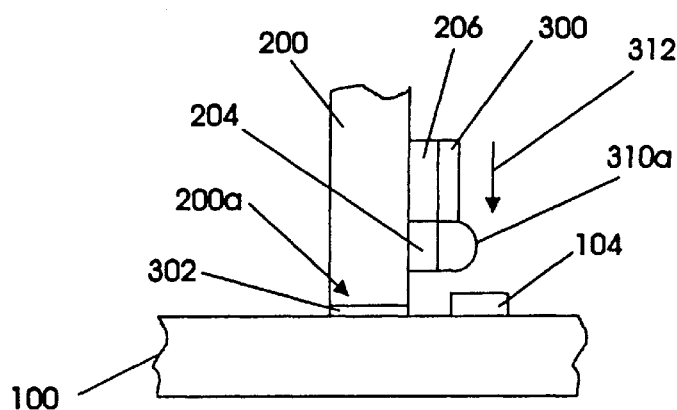
Figure 3C:
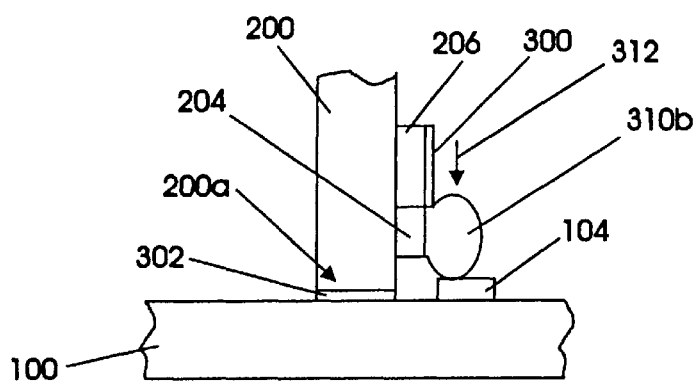
Figure 3D:
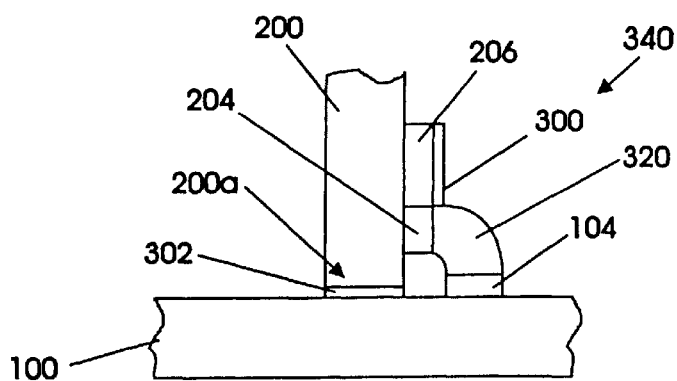

Referring now to FIGS. 3B, 3C and 3D, the solder 300 is reflowed. At first, as shown in FIG. 3B, a solder bump 310*a* forms on pad 204 as solder flows from over elongated pad extension 206 to over pad 204 in the direction shown by arrow 312. Solder flows from the elongated pad extension onto the respective pad due to the surface tension within the solder which causes the flowing solder to flow from the relatively thin extension to the relatively wide pad, as described in the aforesaid application Ser. No. 08/416,619 to Rinne et al.

As shown in FIG. 3C, as the reflow continues, an expanding volume solder bump 310*b* forms as more and more of the solder flows from over elongated pad extension 206 to over pad 204. As also shown in FIG. 3C, the reflow causes the expanding volume solder bump 310*b* to laterally expand beyond the edge 200*a* of the second microelectronic substrate 200 and thereby contact the pad 104 on the first substrate 100.

Finally, referring to FIG. 3D, once the expanding solder bump contacts pad 104, the surface tension of the solder will create an arched solder column 320 which extends from the pad 204 on second substrate 200 to the pad 104 on the first substrate 100. The arched solder column 320 may be regarded as a partial ring, here a quarter ring, of solder. As also shown, the arched solder column preferably includes a uniform transverse cross-section which thereby forms an excellent conductor for high frequency microelectronic signals. In other configurations, the cross-section need not be uniform. Thus, for example, both pads may be rectangles, but may be rotated 90° relative to one another, so that the arched solder column rotates by 90° and can rotate the polarization of plane waves traversing the arch by 90°. The arched solder columns may be used for mechanical and/or electrical connections in the microelectronic package 340.

Additional description of the microelectronic packaging method of FIGS. 3A–3D will now be provided. As illustrated in FIGS. 3A–3D, solder 300 is formed using a patterned plating template that defines regions that will have differing internal pressures in the molten solder during reflow. During reflow, the molten solder flows preferentially to the low pressure regions, thereby forming a large bump that extends past the edge of the substrate. The bump can wet the solder pad and form an arched solder column that provides electrical connection and/or mechanically supports the package.

The method of FIGS. 3A–3D describes forming a solder bump on substrate 200. It will also be understood that the solder bump may be formed on substrate 100 and may expand to contact a pad on substrate 200. In another alternative, solder bumps may be formed on both substrates, and may expand to contact one another and thereby form the arched solder column 320.

The arched columns 320 offer several electrical and mechanical advantages. The circular cross-section is an excellent geometry for electrical signal propagation and can provide a controlled transition for microwave and millimeter wave signals. The arched columns may also provide structural support, while allowing some compliance for improved reliability, as opposed to a traditional fillet shape.

The microelectronic package 340 may provide many new system assembly options with low weight, compactness, good thermal management, together with low cost and potentially enhanced performance. One application of the technology is a compact, low cost multi-chip module assembly where there may be significant reduction in the area devoted to the second level package. A typical application may be for large scale memories. Another application may be in mixed signal assembly integration. Thus, for example, an assembly may be provided with mixed analog/digital/microwave systems in a compact package, as illustrated below.

Figure 4:
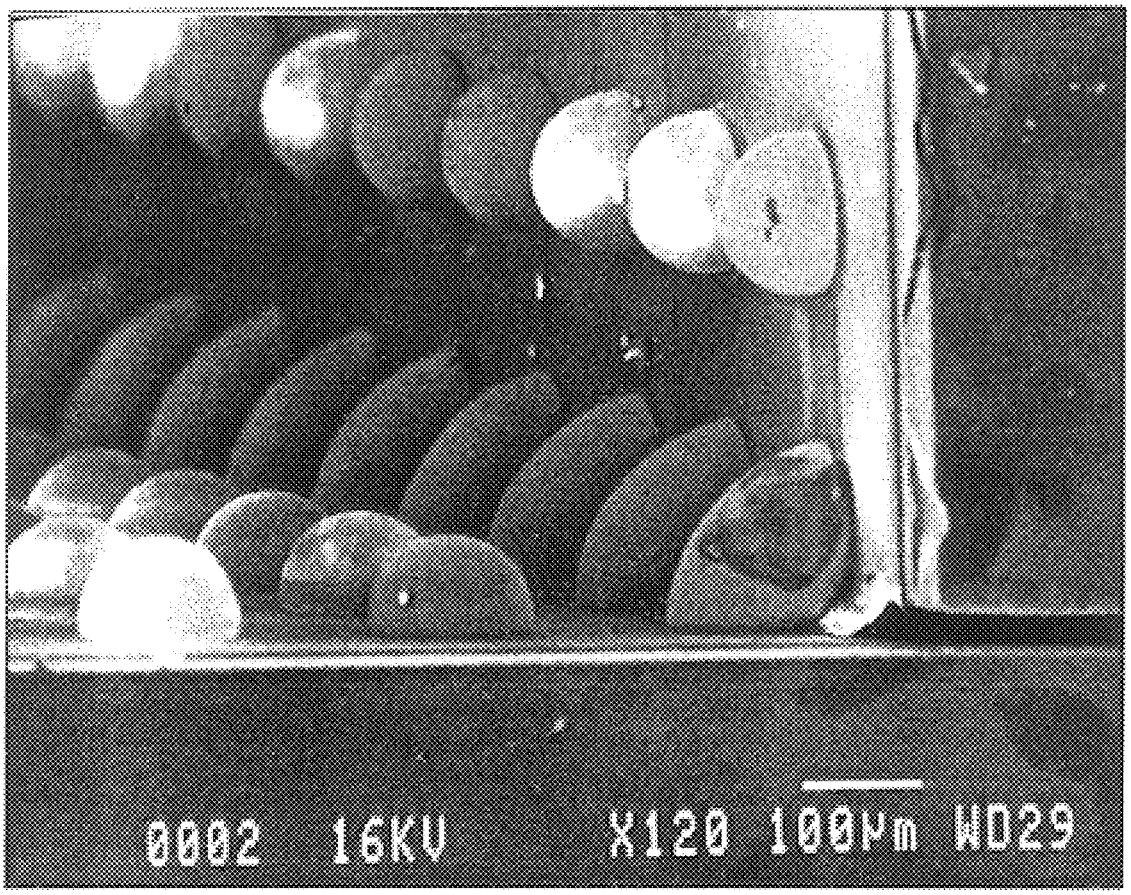
FIG. 4 is a scanning electron microscope photomicrograph of a microelectronic package according to the present invention.

The method illustrated in FIGS. 3A–3D has been demonstrated using a one centimeter square integrated circuit chip with 41–125 $\mu$m solder bumps on 250 $\mu$m centers along one edge. This chip was mounted perpendicular to a second chip. Prior to assembly, the first chip was coated with a bonding layer in the form of a rosin-based flux to provide enough tack to hold the chip in position during the reflow process. The vertical chip was aligned and placed by hand under a stereo microscope at 10X magnification. The assembly was then reflowed in a nitrogen inert infrared belt furnace. An SEM photomicrograph of the package including the arched solder columns is shown in FIG. 4. As shown in FIG. 4, the technique allows large solder bumps to form at the very edge of a substrate such that the bump extends beyond the edge, thus contacting a pad on the mating surface.

The solder bumps may be formed on a variety of surfaces, allowing a great variety of options for both the vertical and horizontal components of the assembly. Solder bumps may be deposited on silicon, alumina, aluminum nitride and quartz. It is also possible to use diamond, ferrite, copper and other materials. When used with eutectic PbSn or other low melting point solders, organic substrates such as FR-4, BT resin, polyimide and flex circuits also may be used and may offer advantages in cost or flexibility.

It will be understood that because the connections are made at the edge of a substrate, applications may be limited to substrates which have relatively low input/output requirements. However, solder connections on pitches as small as 0.050 mm may be presently made for a connection density of 200 connections per centimeter. If connections are made at each edge of a one centimeter by one centimeter substrate, 800 connections may be provided for the substrate.

Having described the joining of first and second orthogonal substrates to one another according to the present invention, many other structures may also be formed. For ease of illustration, FIGS. 5–11 show only the substrates and the arched solder columns. The pads and elongated pad extensions are not illustrated.

Figure 5:
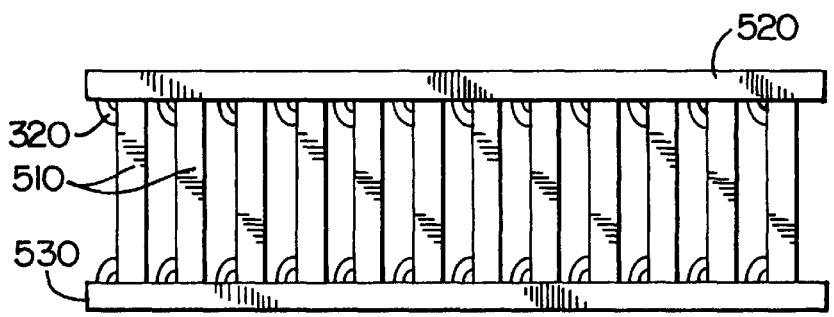
Figure 6:
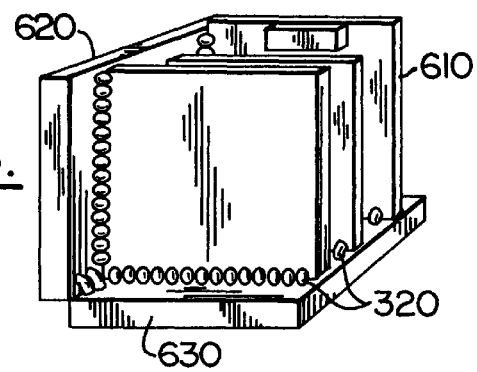

FIG. 5 illustrates a microelectronic package wherein opposing edges of a plurality of first substrates 510 are mounted between spaced apart second and third substrates 520 and 530 using arched solder columns 320. As shown in FIG. 5, the second and third substrates 520 and 530 are mounted on opposite edges of the first substrates 510. In contrast, as shown in FIG. 6, the adjacent edges of first substrates 610 are mounted on orthogonally oriented second and third substrates 620 and 630 using arched solder columns 320. As also shown in FIG. 6, arched solder columns are used to connect the orthogonally oriented second and third substrates 620 and 630.

Figure 7:
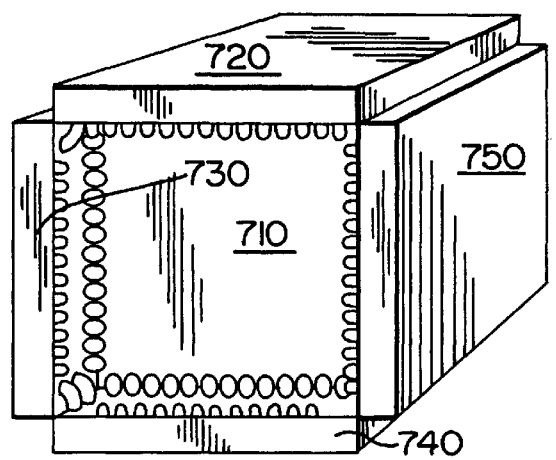
Figure 8:
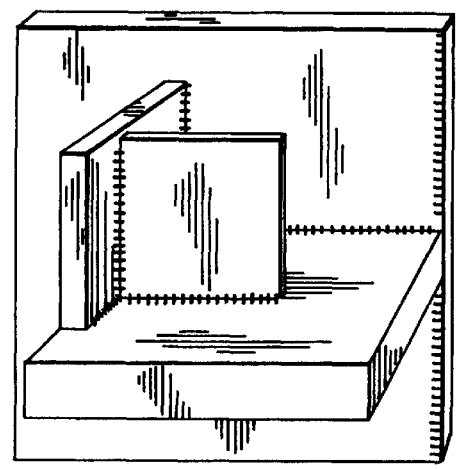

FIG. 7 illustrates second, third, fourth and fifth substrates 720, 730, 740 and 750 respectively, which are mounted on respective edges of a plurality of first substrates 710. FIG. 8 illustrates a three-dimensional building of substrates at every plane intersection.

The microelectronic packages of FIGS. 5–8 offer the advantages of three-dimensional packaging using a low cost, reworkable fabrication process. In all of these figures, the vertical components may be solder bumped chips, chips with discrete components mounted on the front surface, or even other multi-chip substrates. Using this three dimensional packaging technology, ultra-dense multi-chip modules or multi-module modules can be fabricated with volumetric utilization approaching 75%, assuming 0.5 mm thick chips placed on 0.675 mm centers. By comparison, typical planar modules have volumetric utilizations which only generally approach 25%, assuming 50% silicon area coverage with 0.5 mm substrates.

FIG. 9 illustrates another embodiment of the present invention wherein various mixed technologies are assembled using three-dimensional packaging. For ease of illustration, the arched solder columns are not shown. Substrate 900 may be an active or passive substrate. Mounted on the substrate 900 may be an optoelectronics chip or module 910 and a microelectromechanical system (MEMS) 920. A ferrite sandwich 930 may also be mounted. A small signal MMIC 940 and a power amplifier MMIC 950 may also be mounted. A processor with on-chip decoupling 960 may be provided, as well as memory 970. A multi-chip module 980 with discrete components may be provided, as well as an antenna 990. Thus, different technologies may be integrated and a number of new microwave components may be provided. The arched solder columns, which are not shown in FIG. 9 for purposes of simplification, can provide an excellent electrical signal transmission path as well as mechanical support for the various substrates.

FIG. 10 illustrates another embodiment of a microelectronic package according to the present invention. In contrast with the orthogonal connections which were heretofore shown, FIG. 10 illustrates oblique connections. A plurality of substrates 100 are connected to each other and to a second substrate 200 using edge connections on the substrate 100. Orthogonal edge connections and oblique edge connections are illustrated.

FIGS. 11A and 11B illustrate a side perspective view and a front perspective view respectively, of another non-orthogonal substrate mounting. As shown, three triangular substrates 1100, 1110 and 1120 are mounted at 60° angles. The three substrates may create a retroreflector for laser beams or other microelectronic devices. It will be understood that one of the substrates, such as substrate 1120, may be a nontriangular substrate on which two triangular substrates are mounted at oblique angles.

Figure 12:
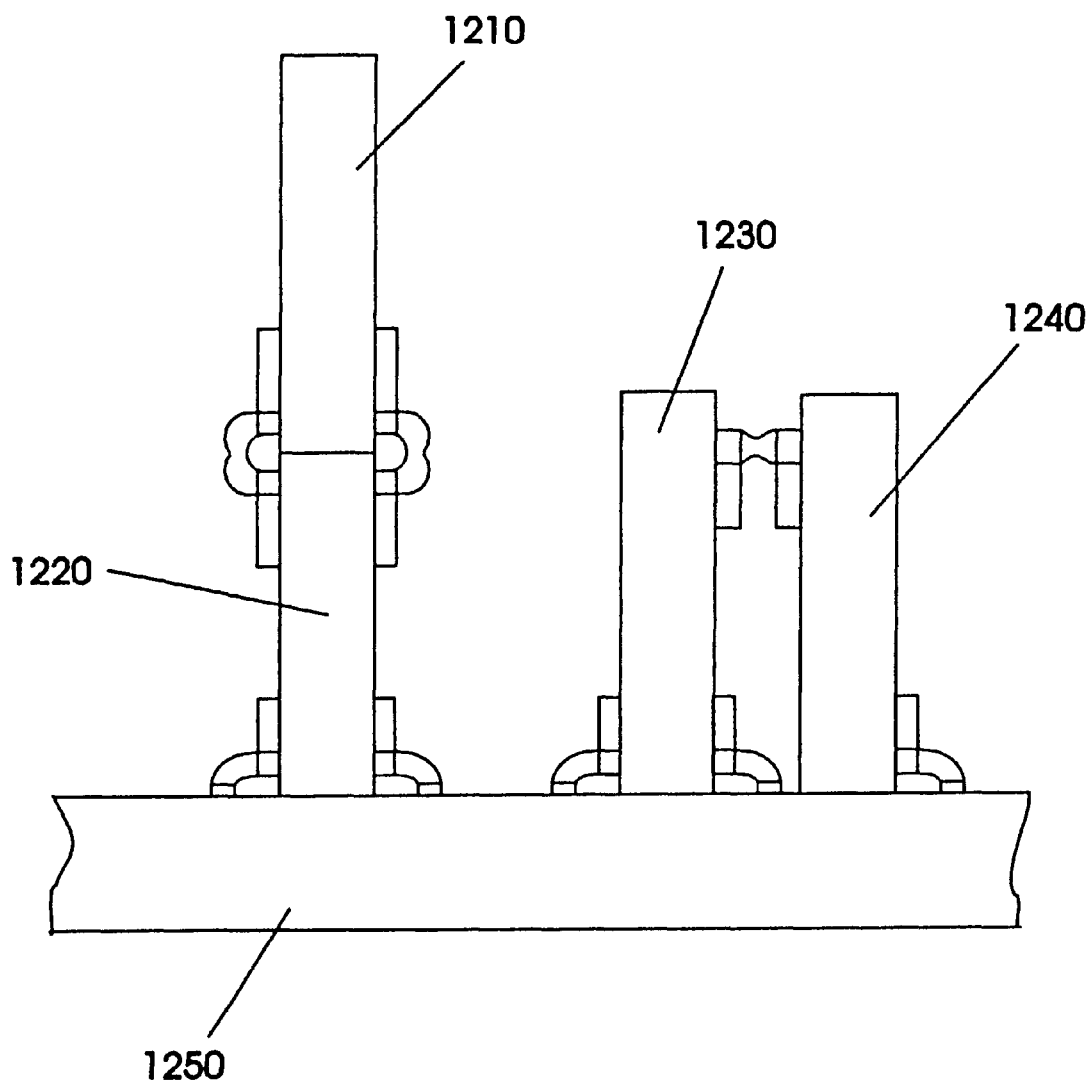

FIG. 12 illustrates another microelectronics package according to the invention. As shown, coplanar substrates 1210 and 1220 are attached using adjacent rows of pads and elongated regions according to the invention. As illustrated in FIG. 12, the solder bumps on substrates 1210 and 1220 expand laterally beyond the edge of the substrate to join and form a single bump. Although a double bumped structure is shown, the structure may also take the form of an arched solder column (half ring) depending upon the geometries involved. As also shown in FIG. 12, the solder reflow from the elongated region into the pad may also be used to cause bumps on adjacent parallel spaced apart substrates 1230 and 1240 to electrically contact one another. It will be understood by those having skill in the art that in solder bumps may be formed on only one of the substrates 1210 or 1220 and on only one of the substrates 1230 and 1240. Quarter ring arched solder column connections to substrate 1250 are also shown.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a microelectronic package comprising the steps of:

orienting a first microelectronic substrate relative to a second microelectronic substrate, such that an edge of said second microelectronic substrate is adjacent said first microelectronic substrate, with one of the first and second microelectronic substrates including a plurality of solder bumps thereon adjacent the edge of the second microelectronic substrate; and expanding the plurality of solder bumps to extend to and contact the other of the first and second microelectronic substrates.

2. A method according to claim 1 wherein said expanding step comprises the step of reflowing additional solder into the plurality of solder bumps.

3. A method according to claim 2 wherein the step of reflowing comprises the step of reflowing solder from an elongated, solder covered region adjacent the solder bump, into the solder bump.

4. A method according to claim 1 wherein said orienting step comprises the step of obliquely orienting said first microelectronic substrate relative to said second microelectronic substrate.

5. A method according to claim 1 wherein said orienting step comprises the step of orthogonally orienting said first microelectronic substrate relative to said second microelectronic substrate.

6. A method according to claim 1 wherein said orienting step comprises the step of orienting said first microelectronic substrate in nonparallel relationship relative to said second microelectronic substrate.

7. A method according to claim 1 wherein said orienting step comprises the step of orienting said first microelectronic substrate in coplanar relationship relative to said second microelectronic substrate, such that said edge of said second microelectronic substrate is adjacent an edge of said first microelectronic substrate.

8. A method of forming a microelectronic package comprising the steps of:

orienting a first microelectronic substrate relative to a second microelectronic substrate, such that an edge of said second microelectronic substrate is adjacent said first microelectronic substrate, with the second microelectronic substrate including a plurality of solder bumps thereon adjacent the edge of the second microelectronic substrate; and causing the plurality of solder bumps to extend laterally beyond the edge of the second microelectronic substrate, to contact the first microelectronic substrate.

9. A method according to claim 8 wherein said causing step comprises the step of expanding the plurality of solder bumps to thereby cause the plurality of solder bumps to expand laterally beyond the edge of the second microelectronic substrate.

10. A method according to claim 9 wherein said expanding step comprises the step of reflowing additional solder into the plurality of solder bumps.

11. A method according to claim 10 wherein the step of reflowing comprises the step of reflowing solder from an elongated, solder covered region adjacent the solder bump, into the solder bump.

12. A method according to claim 8 wherein said orienting step comprises the step of obliquely orienting said first microelectronic substrate relative to said second microelectronic substrate.

13. A method according to claim 8 wherein said orienting step comprises the step of orthogonally orienting said first microelectronic substrate relative to said second microelectronic substrate.

14. A method according to claim 8 wherein said orienting step comprises the step of orienting said first microelectronic substrate in nonparallel relationship relative to said second microelectronic substrate.

15. A method according to claim 8 wherein said orienting step comprises the step of orienting said first microelectronic substrate in coplanar relationship relative to said second microelectronic substrate, such that said edge of said second microelectronic substrate is adjacent an edge of said first microelectronic substrate.

16. A method of forming a microelectronic package comprising the steps of:

orienting a first microelectronic substrate relative to a second microelectronic substrate, such that an edge of said second microelectronic substrate is adjacent said first microelectronic substrate, said first microelectronic substrate including a first row of pads and said second microelectronic substrate including a second row of pads adjacent and extending along said edge of said second microelectronic substrate, one of said first and second rows of pads including a plurality of elongated pad extensions which are narrower than the pads, a respective one of said elongated pad extensions being connected to a respective pad in said one of said first and second rows of pads, said elongated pad extensions and said one of said rows of pads including solder thereon; and reflowing the solder to thereby cause solder to flow from the respective elongated pad extensions onto the respective pads, to thereby create respective expanding volume solder bumps on the respective pads, and cause the expanding volume solder bumps to contact respective pads on the other of the first and second rows of pads.

17. A method according to claim 16 wherein said second row of pads includes said plurality of elongated pad extensions, and wherein said reflowing step comprises the step of:

reflowing the solder to thereby cause solder to flow from the respective elongated pad extensions onto the respective pads, to thereby create respective expanding volume solder bumps on the respective pads which laterally expand beyond said edge of said second microelectronic substrate, and cause the expanding volume solder bumps to contact respective pads on said first row of pads.

18. A method according to claim 16 wherein said orienting step comprises the step of obliquely orienting said first microelectronic substrate relative to said second microelectronic substrate.

19. A method according to claim 16 wherein said orienting step comprises the step of orthogonally orienting said first microelectronic substrate relative to said second microelectronic substrate.

20. A method according to claim 16 wherein said orienting step comprises the step of orienting said first microelectronic substrate in nonparallel relationship relative to said second microelectronic substrate.

21. A method according to claim 16 wherein said orienting step comprises the step of orienting said first microelectronic substrate in coplanar relationship relative to said second microelectronic substrate, such that said edge of said second microelectronic substrate is adjacent an edge of said first microelectronic substrate.

* * * * *